(12) United States Patent
Takahashi

(10) Patent No.: US 8,987,036 B2
(45) Date of Patent: Mar. 24, 2015

(54) SOLAR BATTERY MODULE AND SOLAR BATTERY ARRAY

(71) Applicant: Sharp Kabushiki Kaisha, Osaka (JP)

(72) Inventor: Naoki Takahashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 225 days.

(21) Appl. No.: 13/841,163

(22) Filed: Mar. 15, 2013

(65) Prior Publication Data

US 2014/0113400 A1 Apr. 24, 2014

Related U.S. Application Data

(62) Division of application No. 13/001,961, filed as application No. PCT/JP2009/061990 on Jun. 30, 2009, now abandoned.

(30) Foreign Application Priority Data

Jul. 2, 2008 (JP) .................................. 2008-173957

(51) Int. Cl.
*H01L 21/00* (2006.01)
*H01L 31/05* (2014.01)
*H01L 31/18* (2006.01)
(Continued)

(52) U.S. Cl.
CPC ............ *H01L 31/0504* (2013.01); *H01L 31/18* (2013.01); *H01L 31/02008* (2013.01); *H01L 31/048* (2013.01); *Y02E 10/50* (2013.01)
USPC .......................................................... 438/67

(58) Field of Classification Search
CPC ..................................................... H01L 31/18
USPC .......................................................... 438/67
See application file for complete search history.

(56) References Cited

U.S. PATENT DOCUMENTS 4,609,770 A 9/1986 Nishiura et al.
5,338,369 A 8/1994 Rawlings
(Continued)

FOREIGN PATENT DOCUMENTS

JP 60-123073 7/1985
JP 2000-286436 10/2000
(Continued)

OTHER PUBLICATIONS

International Search Report for PCT/JP2009/061990, mailed Sep. 15, 2009.

*Primary Examiner* — Evan Pert
(74) *Attorney, Agent, or Firm* — Nixon & Vanderhye, P.C.

(57) ABSTRACT

A solar battery module (40) includes a stack of: a plurality of solar battery strings (30) and bus sections (32) connected to both ends of each of the plurality of solar battery strings (30); flexible resin layers (33a through 33c); and a flexible resin film (34). The flexible resin layers (33a through 33c) and the flexible resin film (34) have, on a light receiving surface side of solar battery cells (20), holes through which the bus sections (32) are each partially exposed. The exposed parts of the bus sections (32) serve as a respective plurality of electrically-connecting means (32a). A solar battery array (41) includes a plurality of solar battery modules (40). The plurality of solar battery modules (40) are electrically connected with each other via the plurality of electrically-connecting means (32a). This makes it possible to achieve a large-scale solar battery array (41) with high mechanical strength.

11 Claims, 13 Drawing Sheets

(51) Int. Cl.
*H01L 31/02* (2006.01)
*H01L 31/048* (2014.01)

(56) References Cited

U.S. PATENT DOCUMENTS

| | | | |
|---|---|---|---|
| 5,578,141 A | 11/1996 | Mori et al. | |
| 5,717,255 A | 2/1998 | Haga et al. | |
| 6,471,816 B1 | 10/2002 | Shuto et al. | |
| 6,812,399 B2 | 11/2004 | Shaheen et al. | |
| 7,612,283 B2 * | 11/2009 | Toyomura et al. | 136/244 |
| 8,552,519 B2 * | 10/2013 | Nakata | 257/444 |
| 2003/0140959 A1 | 7/2003 | Gaudiana et al. | |
| 2003/0159729 A1 | 8/2003 | Shaheen et al. | |
| 2003/0188776 A1 | 10/2003 | Li et al. | |
| 2003/0188777 A1 | 10/2003 | Gaudiana et al. | |
| 2003/0189402 A1 | 10/2003 | Gaudiana et al. | |
| 2003/0192583 A1 | 10/2003 | Ryan | |
| 2003/0192584 A1 | 10/2003 | Beckenbaugh et al. | |
| 2003/0192585 A1 | 10/2003 | Beckenbaugh et al. | |
| 2003/0230337 A1 | 12/2003 | Gaudiana et al. | |
| 2004/0025933 A1 | 2/2004 | Chittibabu et al. | |
| 2004/0025934 A1 | 2/2004 | Chittibabu et al. | |
| 2004/0031520 A1 | 2/2004 | Ryan et al. | |
| 2004/0094196 A1 | 5/2004 | Shaheen et al. | |
| 2004/0187911 A1 | 9/2004 | Gaudiana et al. | |
| 2004/0233502 A1 | 11/2004 | Brabec et al. | |
| 2005/0011550 A1 | 1/2005 | Chittibabu et al. | |
| 2005/0019414 A1 | 1/2005 | Chittibabu et al. | |
| 2005/0039790 A1 | 2/2005 | Chittibabu et al. | |
| 2005/0040374 A1 | 2/2005 | Chittibabu et al. | |
| 2005/0045851 A1 | 3/2005 | He et al. | |
| 2005/0067006 A1 | 3/2005 | Eckert et al. | |
| 2005/0067007 A1 | 3/2005 | Toft | |
| 2005/0122469 A1 | 6/2005 | Brabec | |
| 2005/0126623 A1 | 6/2005 | Rogler et al. | |
| 2005/0189014 A1 | 9/2005 | Gaudiana et al. | |
| 2005/0211292 A1 | 9/2005 | Chittibabu et al. | |
| 2005/0211294 A1 | 9/2005 | Chittibabu et al. | |
| 2005/0257827 A1 | 11/2005 | Gaudiana et al. | |
| 2005/0263178 A1 | 12/2005 | Montello et al. | |
| 2005/0263179 A1 | 12/2005 | Gaudiana et al. | |
| 2005/0263180 A1 | 12/2005 | Montello et al. | |
| 2005/0268962 A1 | 12/2005 | Gaudiana et al. | |
| 2005/0274408 A1 | 12/2005 | Li et al. | |
| 2005/0284513 A1 | 12/2005 | Brabec | |
| 2006/0005876 A1 | 1/2006 | Gaudiana et al. | |
| 2006/0011233 A1 | 1/2006 | Sariciftci et al. | |
| 2006/0011894 A1 | 1/2006 | Brabec et al. | |
| 2006/0076048 A1 | 4/2006 | Gaudiana et al. | |
| 2006/0090791 A1 | 5/2006 | Gaudiana et al. | |
| 2006/0107996 A1 | 5/2006 | Shaheen et al. | |
| 2006/0130895 A1 | 6/2006 | Gaudiana et al. | |
| 2006/0147616 A1 | 7/2006 | Gaudiana et al. | |
| 2006/0207652 A1 | 9/2006 | Brabec et al. | |
| 2006/0216610 A1 | 9/2006 | Galvin et al. | |
| 2007/0012349 A1 | 1/2007 | Gaudiana et al. | |
| 2007/0062577 A1 | 3/2007 | Koppe | |
| 2007/0095387 A1 | 5/2007 | Fujii et al. | |
| 2007/0102040 A1 | 5/2007 | Beckenbaugh et al. | |
| 2007/0107776 A1 | 5/2007 | Li et al. | |
| 2007/0131277 A1 | 6/2007 | Gaudiana et al. | |
| 2007/0204904 A1 | 9/2007 | Brooks et al. | |
| 2007/0251570 A1 | 11/2007 | Eckert et al. | |
| 2008/0217587 A1 | 9/2008 | Gaudiana et al. | |
| 2009/0050207 A1 | 2/2009 | Galvin et al. | |
| 2009/0256106 A1 | 10/2009 | Gaudiana et al. | |
| 2009/0272934 A1 | 11/2009 | Chittibabu et al. | |
| 2010/0255624 A1 | 10/2010 | Ryan | |
| 2011/0095236 A1 | 4/2011 | Brabec et al. | |
| 2011/0308604 A1 | 12/2011 | Gaudiana et al. | |

FOREIGN PATENT DOCUMENTS

| | | |
|---|---|---|
| JP | 2004-47778 | 2/2004 |
| JP | 2005-276896 | 10/2005 |
| JP | 2006-12802 | 1/2006 |
| JP | 2006-339684 | 12/2006 |

* cited by examiner

F I G. 5
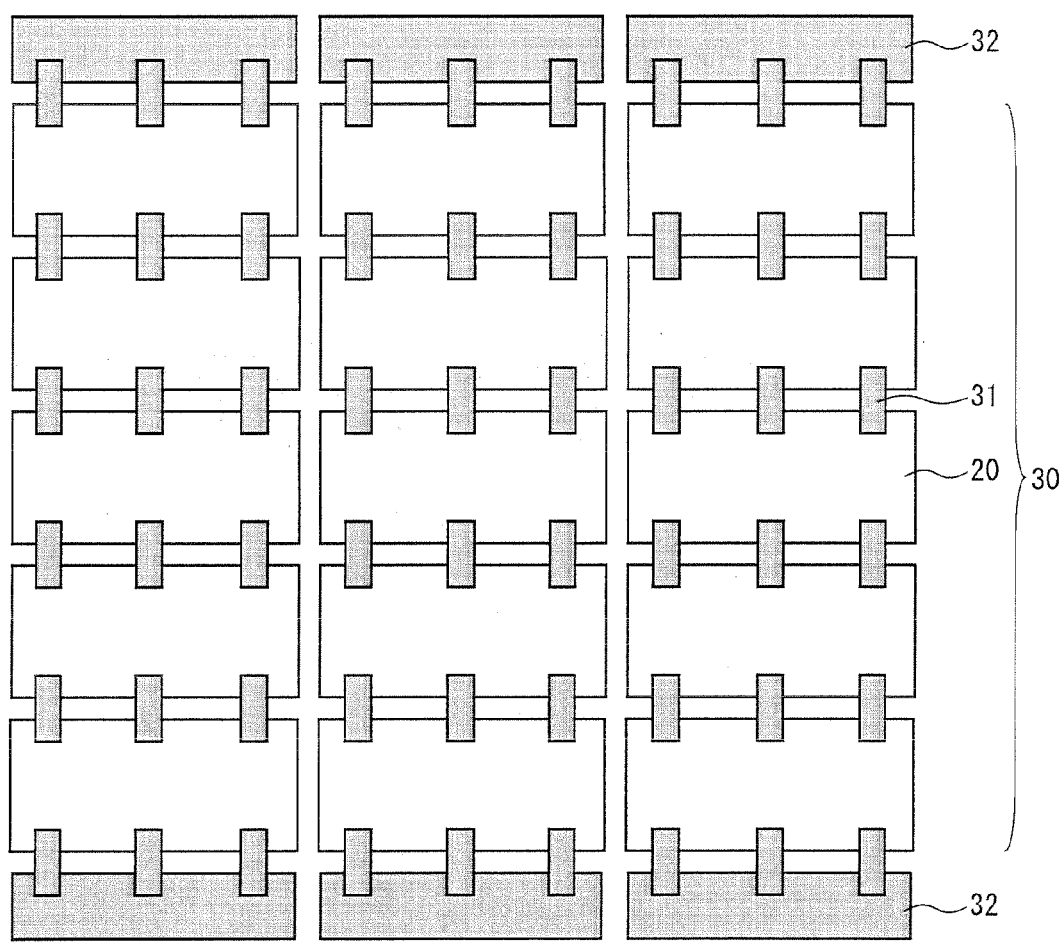

F I G. 7
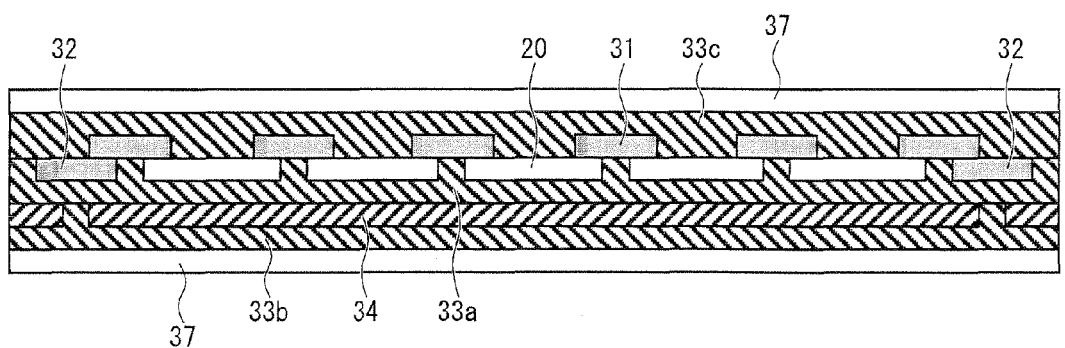

SOLAR BATTERY MODULE AND SOLAR BATTERY ARRAY

CROSS REFERENCE TO RELATED APPLICATIONS

This application is a divisional of U.S. application Ser. No. 13/001,961 filed Dec. 29, 2010, which is a U.S. national phase of International Application No. PCT/JP2009/061990 filed 30 Jun. 2009, which designated the U.S. and claims priority to JP Application No. 2008-173957 filed 2 Jul. 2008, the entire contents of each of which are hereby incorporated by reference.

TECHNICAL FIELD

The present invention relates to a solar battery module and a method for producing a solar battery module.

BACKGROUND ART

In recent years, a solar battery module has been attracting attention in view of effective use of resources and prevention of environmental contamination etc., because the solar battery module directly converts sunlight into electrical energy. In particular, since there has been increasing need for a lightweight and large-area solar battery module, development of such a solar battery module has been carried out.

For example, Patent Literature 1 discloses a solar battery module mounted on a sheet member. The solar battery module shown in Patent Literature 1 is described below with reference to FIGS. 12 and 13. FIG. 12 is a plan view illustrating (i) a sheet member 61 and a solar battery module 60 mounted on the sheet member 61. FIG. 13 is a cross-sectional view illustrating the solar battery module 60.

As illustrated in FIG. 12, the solar battery module 60 is sewed on the sheet member 61 with a thread 62. Further, as illustrated in FIG. 13, the solar battery module 60 is configured such that solar battery cells 65 are sealed within a sealing resin 66, which is sandwiched between a light receiving surface protection film 63 and a back surface protection film 64.

According to Patent Literature 1, a large-area solar battery module is formed by sewing a plurality of the foregoing solar battery modules 60 onto the sheet member 61. Note however that, while volume of the light receiving surface protection films 63 and the back surface protection films 64 with respect to volume of the large-area solar battery module is approximately 66%, volume of the sheet member 61 with respect to the volume of the large-area solar battery module is approximately 33%. Further, the sheet member 61 is greater in weight than the light receiving surface protection films 63 etc., because the sheet member is made from material with high mechanical strength. Accordingly, total weight of the large-area solar battery module is markedly large because of the sheet member 61.

On the other hand, there has been developed a large-area solar battery sheet that is constituted by a combination of flexible solar battery modules without a sheet member. For example, a conventional solar battery sheet array illustrated in FIG. 15 is described below. (a) of FIG. 15 is a plan view illustrating the solar battery sheet array. (b) of FIG. 15 is a cross-sectional view taken along line I-I' of (a) of FIG. 15.

The solar battery sheet array illustrated in FIG. 15 is constituted by a plurality of unit solar battery sheets 110. FIG. 14 illustrates one of the plurality of unit solar battery sheets 110. (a) of FIG. 14 is a plan view illustrating one of the unit solar battery sheet. (b) of FIG. 14 is a cross-sectional view taken along line H-H' of (a) of FIG. 14. The unit solar battery sheet 110 is configured such that (i) solar battery cells 104 are electrically connected in series with one another via inter connectors 105, and (ii) both ends of an electrical connection among the solar battery cells 104 are connected to respective bus sections 106a, which collect electric power.

Each of the bus sections 106a of the unit solar battery sheet 110 is protruded from a flexible resin film 101, a back surface protection member 102, and a silicon resin 103 so that the plurality of unit solar battery sheets 110 can be electrically connected with one another as illustrated in FIG. 15.

The solar battery sheet array shown in FIG. 15 is configured such that protruded parts of bus sections 106 of adjacent ones of the plurality of unit solar battery sheets 110 are welded together to form a welded part 107 and thereby the plurality of unit solar battery sheets 110 are electrically connected with one another via the welded parts 107. In addition, adjacent ones of the plurality of unit solar battery sheets 110 are physically connected with each other with use of an adhesive agent 108. The adhesive agent 108 fixes also a corresponding one of the welded parts 107, and has protection films 109 on its both surfaces.

According to the configuration as shown in FIG. 15, a large-area solar battery sheet array is formed without a sheet member. Therefore, with this configuration, it is possible to achieve a lightweight and large-area solar battery sheet array.

CITATION LIST

Patent Literatures

Patent Literature 1
Japanese Patent Application Publication, Tokukai, 2006-339684 A (Publication Date: Dec. 14, 2006)

SUMMARY OF INVENTION

Technical Problem

However, according to the solar battery sheet array shown in FIG. 15, a connection part between adjacent ones of the plurality of solar battery modules 110 is not uniform in its flexibility and strength. For example, see a cross-sectional view taken along line J-J'. According to the cross-sectional view, a left one-third of the connection part between adjacent ones of the plurality of solar battery modules 110 is constituted by the protection films 109, the adhesive agent 108, and corresponding ones of the bus sections 106. On the other hand, the other two-thirds of the connection part is constituted by the protection films 109 and the adhesive agent 108. That is, the connection part shown in the cross-sectional view taken along line J-J' is not uniform in its structure.

For example, in a case where the protection films 109 are made from a radiation-resistant film having high flexibility and low strength, the two-thirds of the connection part shown in the cross-sectional view taken along line J-J' is constituted by (i) the protection films 109 with low strength and (ii) the adhesive agent 108. That is, the two-thirds of the connection part has markedly low strength.

On the other hand, for example in a case where the protection films 109 are made from a radiation-resistant film having low flexibility and high strength, the left one-third of the connection part shown in the cross-sectional view taken along line J-J' includes (i) the protection films 109 with low flexibility and (ii) the bus sections 106 made from metal. That is, the left one-third of the connection part has markedly low flexibility.

As such, according to the solar battery sheet array shown in FIG. 15, it is difficult to achieve both of flexibility and mechanical strength of the connection part between adjacent ones of the plurality of solar battery modules.

The present invention has been made in view of the problems, and an object of the present invention is to provide (i) a large-scale solar battery array with improved flexibility and improved mechanical strength and (ii) a solar battery module for constituting the solar battery array.

Solution to Problem

In order to attain the above object, a solar battery module in accordance with the present invention is a solar battery module for constituting a solar battery array, including: at least one solar battery string that is constituted by a plurality of solar battery cells electrically connected in series with each other; bus sections electrically connected with respective endmost ones of the plurality of solar battery cells that constitute said at least one solar battery string; and at least one flexible resin layer provided on each of both sides, which are a first side and a second side, of the solar battery module so as to sandwich said at least one solar battery string and the bus sections, the first side of the both sides of the solar battery module having first holes, through which the bus sections are each partially exposed, and the bus sections having areas which are exposed through the respective first holes, the areas serving as a respective plurality of electrically-connecting means.

A plurality of solar battery modules in accordance with the present invention are to constitute a solar battery array by being electrically connected with each other. In a case where each of the plurality of the solar battery modules is constituted by a flexible material, the each of the plurality of the solar battery modules is used as a flexible solar battery sheet. Accordingly, the solar battery array constituted by the plurality of solar battery modules is used as a flexible solar battery sheet array.

The plurality of solar battery modules in accordance with the present invention are electrically connected with each other via the plurality of electrically-connecting means of the bus sections. Note here that the plurality of electrically-connecting means of the bus sections can be connected with a wire by soldering etc. According to this configuration, the plurality of solar battery modules can be connected with each other via the wire. The bus sections are connected with respective endmost ones of the plurality of solar battery cells connected with each other, and collect electric power. Generally, the bus sections are made from metal.

According to this configuration, the plurality of electrically-connecting means of the bus sections are exposed through the respective first holes. Therefore, each of the bus sections is configured such that it does not protrude from the at least one flexible resin layer. Accordingly, there are no other members (e.g., the bus sections) between adjacent ones of the plurality of solar battery modules when the plurality of solar battery modules are electrically connected with each other. This makes it possible to achieve an advantage that the connected plurality of solar battery modules as a whole maintains its flexibility and keeps its mechanical strength uniform.

A solar battery array in accordance with the present invention includes: a plurality of the foregoing solar battery modules, the plurality of solar battery modules being electrically connected in series with each other via corresponding ones of the plurality of electrically-connecting means, each of which serves as an end of an electrical connection in a corresponding one of the solar battery strings electrically connected in series with each other.

According to this configuration, it is possible to easily produce a large-scale solar battery array in accordance with the present invention by connecting the plurality of solar battery modules. In addition, according to the solar battery array in accordance with the present invention, it is possible to improve flexibility of the entire solar battery array because there are no members such as the bus sections between adjacent ones of the plurality of solar battery modules.

Advantageous Effects of Invention

A solar battery module in accordance with the present invention includes a plurality of electrically-connecting means on one of both sides of the solar battery module. Accordingly, by combining a plurality of such solar battery modules, it is possible to make a large-scale solar battery array having improved flexibility and improved mechanical strength.

BRIEF DESCRIPTION OF DRAWINGS

FIG. 5 illustrates how the solar battery strings are arranged.

FIG. 7 is a view with reference to which a production process for a solar battery module of the first embodiment in accordance with the present invention is described.

DESCRIPTION OF EMBODIMENTS

Embodiment 1

A first embodiment in accordance with the present invention is described below with reference to FIGS. 1 through 8.
(Solar Battery Cells 20)

Figure 2:
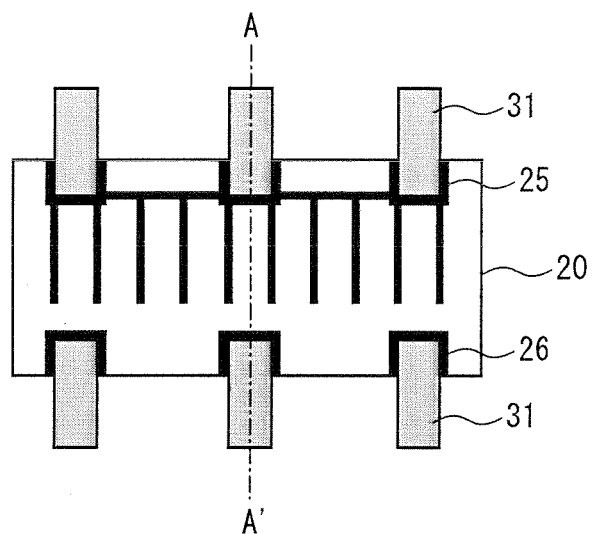
FIG. 2 is a plan view illustrating a light receiving surface of one of solar battery cells.
Figure 3:
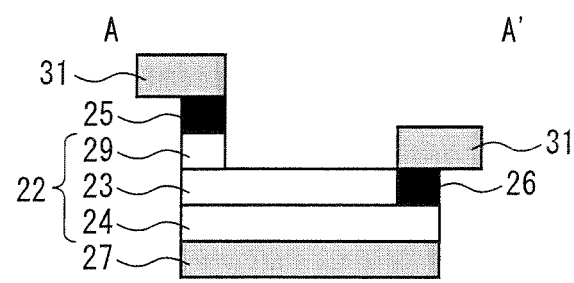
FIG. 3 is a cross-section view, illustrating the solar battery cell, which is taken along line A-A' of FIG. 2.
Figure 4:
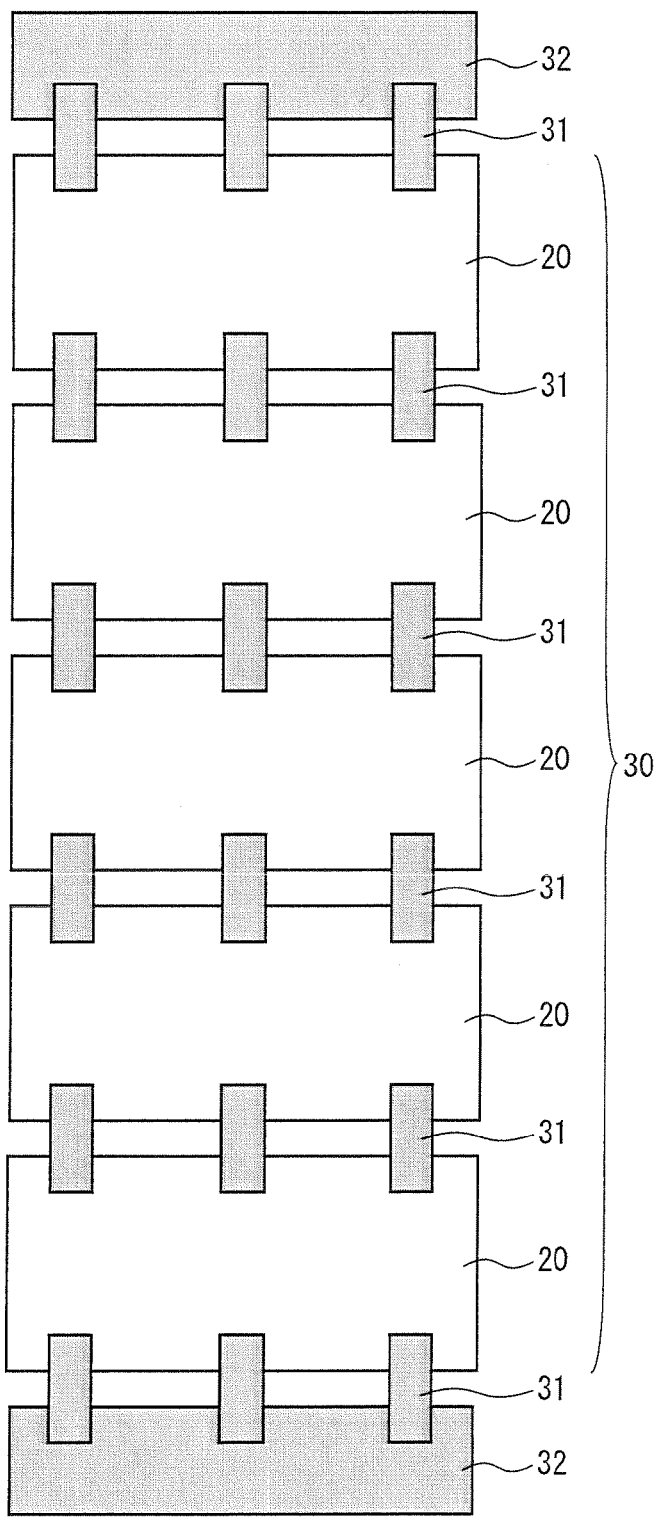
FIG. 4 illustrates one of solar battery strings.
Figure 6:
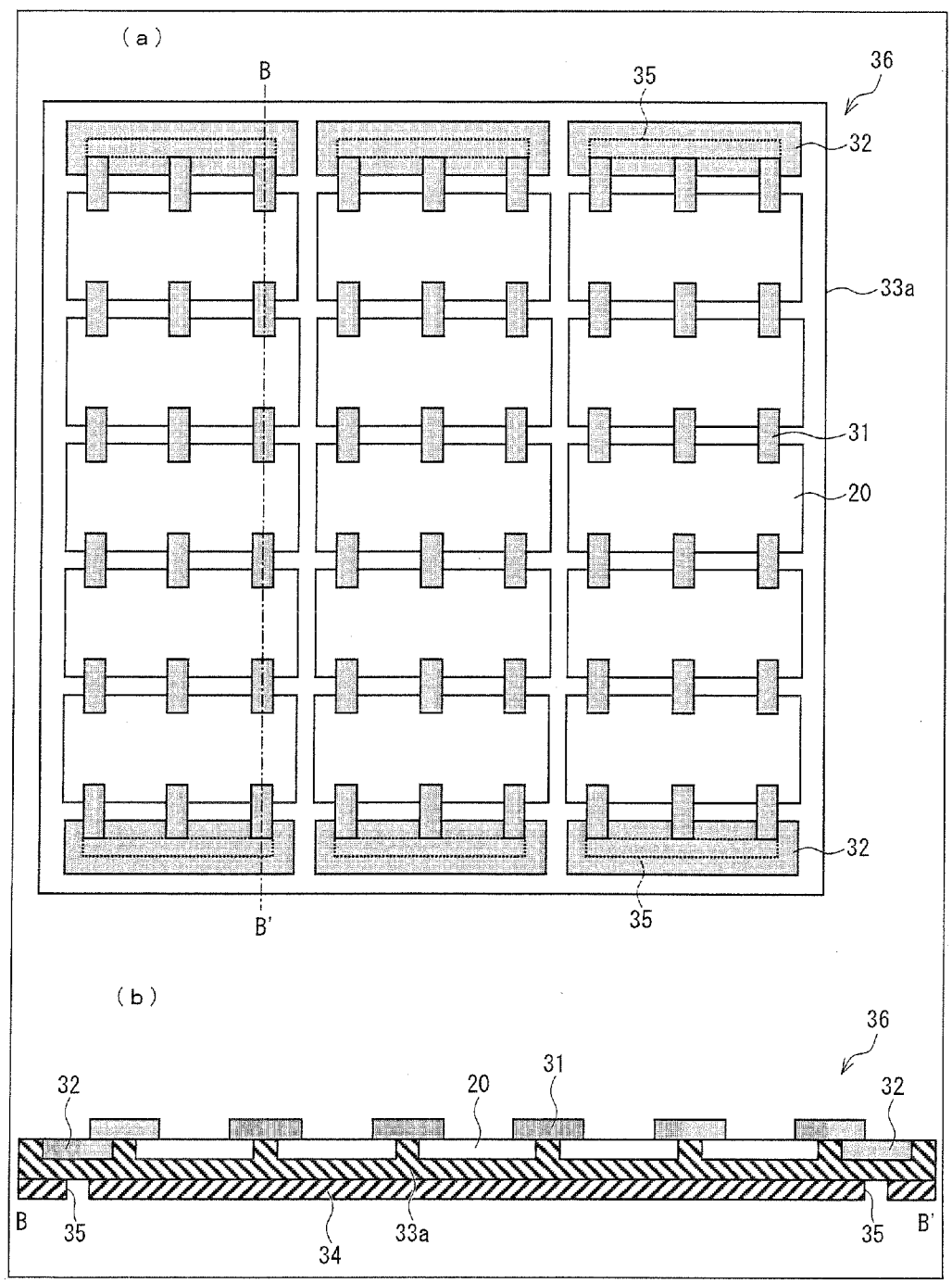
FIG. 6 illustrates a temporarily-jointed solar battery module. (a) of FIG. 6 is a plan view. (b) of FIG. 6 is a cross-sectional view taken along line B-B' of (a) of FIG. 6.

First, the following description discusses, with reference to FIGS. 2 and 3, how solar battery cells 20 used in the present embodiment are schematically configured. FIG. 2 is a plan view illustrating a light receiving surface of one of the solar battery cells 20. FIG. 3 is a cross-sectional view, illustrating the solar battery cell 20, which is taken along line A-A' of FIG. 2.

Each of the solar battery cells 20 has (i) a light receiving surface for receiving sunlight and (ii) a non-light receiving surface opposed to the light receiving surface. Note that, in this Specification, a side on which the light receiving surface of each of the solar battery cells 20 is situated is hereinafter referred to as a light receiving surface side, whereas the other side on which the non-light receiving surface of the each of the solar battery cells 20 is situated is hereinafter referred to as a non-light receiving surface side.

As illustrated in FIGS. 2 and 3, each of the solar battery cells 20 is constituted by a multilayered semiconductor layer 22, an n-type electrode 25, p-type electrodes 26, and a back surface electrode 27. The multilayered semiconductor layer 22 is constituted by: a solar battery layer 23 including a p-n junction between a p-type region and an n-type region; a contact layer 24 via which the p-type electrodes 26 and the solar battery layer 23 are electrically connected with each other; and a contact layer 29 via which the n-type electrode 25 and the solar battery layer 23 are electrically connected with each other.

The n-type electrode 25 has a comb-teeth shape, and is provided on a surface, of the contact layer 29, which is on the light receiving surface side. Each of the p-type electrodes 26 has a rectangular shape, and is provided on a surface, of the contact layer 24, which is on the light receiving surface side. The back surface electrode 27 covers an entire surface of each of the solar battery cells 20, and is provided on a surface, of the contact layer 24, which is on the non-light receiving surface side.

In the present embodiment, each of the solar battery cells 20 is provided with (i) the n-type electrode 25 having three pads and (ii) three p-type electrodes 26. Note, however, that the present invention is not limited to this configuration. Further, shape of each of the back surface electrode 27, the n-type electrode 25, and the p-type electrodes 26 is not limited to those described above, as long as they function as constituents of each of the solar battery cells 20. Furthermore, the configurations of the n-type electrode 25 and the p-type electrodes 26 are interchangeable.

Each of the solar battery cells 20 has, on its light receiving surface side, inter connectors 31 provided on the n-type electrode 25 and on the p-type electrodes 26. The each of the solar battery cells 20 can further have an antireflective film on its light receiving surface.

(Production Method for Solar Battery Cells 20)

The following description discusses a production method for the solar battery cells 20 with reference to FIGS. 2 and 3.

The production method for the solar battery cells 20 includes: a step of forming epitaxial layers on a semiconductor substrate; a step of forming a back surface electrode 27 on the non-light receiving surface side; a step of removing the semiconductor substrate; a step of forming n-type electrodes 25 and p-type electrodes 26 on the light receiving surface side; and a step of separating out the solar battery cells 20.

Each of the steps included in the production method for the solar battery cells 20 is specifically described below. Note, however, that a production method of the present invention is not limited to the production method as described below.

(1) Step of Forming Epitaxial Layers on Semiconductor Substrate

The semiconductor substrate used in this step is for example: an elemental semiconductor substrate such as that made from silicon (Si) and/or germanium (Ge); or a compound semiconductor substrate such as that made from gallium arsenic (GaAs). The semiconductor substrate is preferably a single crystal semiconductor substrate.

First, layers are epitaxially-grown on the semiconductor substrate so as to obtain a multilayered semiconductor layer 22, which is constituted by: a contact layer 24; a contact layer 29; and a solar battery layer 23 including p-n junctions. The multilayered semiconductor layer 22 thus obtained preferably consists of epitaxial layers with small deformation. A thickness of the multilayered semiconductor layer 22 (i.e., a thickness of each of the resulting solar battery cells) is preferably not less than 0.5 µm; however, the thickness is preferably not more than 30 µm so as to ensure flexibility of the solar battery cells 20. The multilayered semiconductor layer 22 can be a compound semiconductor layer, which is a multilayer film including the p-n junctions.

As an alternative, the multilayered semiconductor layer 22 can be formed by MBE (molecular beam epitaxy), MOCVD (metalorganic chemical vapor deposition), VPE (vapor phase epitaxy), or the like.

(2) Step of Forming Back Surface Electrode 27 on Non-Light Receiving Surface Side A back surface electrode 27 is formed on a surface of the multilayered semiconductor layer 22 by a generally-used electrode forming method such as a vapor-deposition method. In order for the back surface electrode 27 to serve as a support of the multilayered semiconductor layer 22, a thickness of the back surface electrode 27 is preferably not less than 1 µm. On the other hand, in order to prevent each of the solar battery cells 20 from warping due to a difference between thermal linear coefficients of expansion between the multilayered semiconductor layer 22 and the back surface electrode 27, the thickness of the back surface electrode 27 is preferably not more than 8 µm. The back surface electrode 27 can be made from a conductive material such as silver (Ag).

(3) Step of Removing Semiconductor Substrate

The entire semiconductor substrate, or the entire semiconductor substrate and part of the multilayered semiconductor layer 22, is/are removed by a generally-used etching method so as to cause the contact layer 29 to be exposed. As an alternative, the semiconductor substrate can be removed from the multilayered substrate layer 22 by an epitaxial lift-off method etc. This step includes formation of mesas, on which n-type electrodes 25 and p-type electrodes 26 are to be formed. First, masks are formed by a generally-used photolithographic method so as to cover only necessary parts of the solar battery layer 23. Then, unnecessary parts of the solar battery layer 23 are removed by an etching method so that the contact layer 24 is partially exposed.

The etching method can be a dry etching method or a wet etching method. Note, however, that it is preferable to employ a selective etching method, in which the etching process substantially stops upon reaching a surface of a certain layer.

(4) Step of Forming N-Type Electrodes 25 and P-Type Electrodes 26

The n-type electrodes 25 and the p-type electrodes 26 are formed on a surface, of the solar battery layer 23, which is on the light receiving surface side. The n-type electrodes 25 and the p-type electrodes 26 are formed by a generally-used electrode forming method such as a photolithographic method, a vapor-deposition method, a lift-off method, or a sintering method. The n-type electrodes 25 and the p-type electrodes 26 can be made from a conductive material such as silver (Ag). Either the n-type electrodes 25 or the p-type electrodes 26 can be formed first, or the n-type electrodes 25 and the p-type electrodes 26 can be formed concurrently.

(5) Step of Separating Solar Battery Cells 20

From the board thus obtained through the above steps, necessary parts only are separated out as the solar battery cells 20. The solar battery cells 20 can be separated out by (i) making a cut in a peripheral outline of each of the solar battery cells 20 by a dicing method or a scribing method, and then (ii) separating out the solar battery cells 20 by an expanding method or a breaking method.

The solar battery cells 20 are obtained through the above steps. Next, a step of forming the inter connectors on the obtained solar battery cells 20 is described below.

(6) Step of Connecting Inter Connectors

The inter connectors 31 are connected to the n-type electrodes 25 and the p-type electrodes 26 by a spot welding method. The inter connectors 31 can be made from a conductive material such as silver (Ag). Shape of each of the inter connectors 31 can be any shape, as long as the each of the inter connectors 31 can be drawn out of the peripheral outline of each of the solar battery cells 20.

(Solar Battery Module 40)

Figure 8:
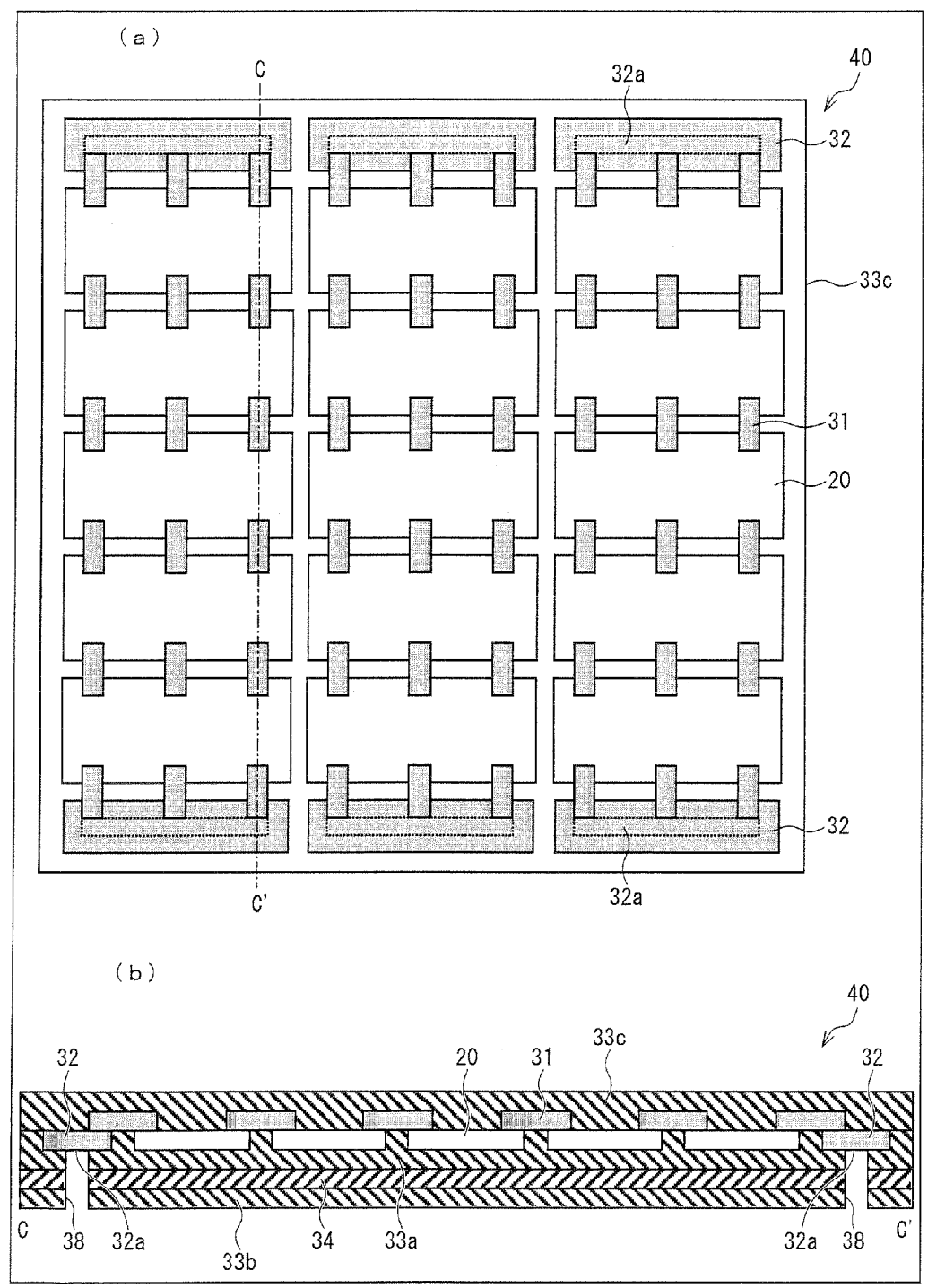
FIG. 8 illustrates the solar battery module of the first embodiment in accordance with the present invention. (a) of FIG. 8 is a plan view. (b) of FIG. 8 is a cross-sectional view taken along line C-C' of (a) of FIG.

The following description discusses a solar battery module 40 of the present embodiment with reference to FIG. 8. FIG. 8 illustrates the solar battery module 40. (a) of FIG. 8 is a plan view. (b) of FIG. 8 is a cross-sectional view taken along line C-C' of (a) of FIG. 8.

The solar battery module 40 is constituted by: the solar battery cells 20; the inter connectors 31; bus sections 32; flexible resin layers 33a, 33b, and 33c; and a flexible resin film 34.

As illustrated in (a) of FIG. 8, the solar battery module 40 includes: five solar battery cells 20 electrically connected in series with one another via a corresponding ones of the inter connectors 31 to form a string. Such a string constituted by a plurality of solar battery cells 20 electrically connected in series with one another is referred to as a solar battery string 30.

Each end of the solar battery string 30 is connected with a corresponding one of the bus sections 32 via corresponding ones of the inter connectors 31. The bus sections 32 are provided at both ends of the solar battery string 30, and collect electric power. The solar battery module 40 includes three solar battery strings 30, each of which is provided with the bus sections 32.

Note here that, in the present invention, (i) the number of the solar battery cells 20 included in each of the solar battery strings 30 and (ii) the number of the solar battery strings 30 are not limited to those described above, and can be any numbers.

As illustrated in (b) of FIG. 8, the solar battery strings 30 include a stack of (i) the flexible resin layers 33a, 33b, and 33c, and (ii) the flexible resin film 34. The flexible resin layer 33c is provided on the light receiving surface side of the solar battery strings 30. The flexible resin layer 33a, the flexible resin film 34, and the flexible resin layer 33b are provided, on the non-light receiving surface side of the solar battery strings 30, such that they are on top of one another in this order from the solar battery cells 20 toward the non-light receiving surface side.

The flexible resin layer 33a, the flexible resin layer 33b, and the flexible resin film 34, which are provided on the non-light receiving surface side, have holes (first holes) 38 penetrating them. Through the holes 38, the bus sections 32 are each partially exposed. The exposed parts of the bus sections 32 serve as a respective plurality of electrically-connecting means 32a. The plurality of electrically-connecting means 32a are on the non-light receiving surface side. Note here that, although one hole 38 is formed in each of the bus sections 32 in the present embodiment, two or more holes 38 can be formed in each of the bus sections 32 as long as mechanical strength can be kept.

According to this configuration, a plurality of solar battery modules 40 can be connected with each other via the plurality of electrically-connecting means 32a so as to form a solar battery array. Since such a solar battery array is configured such that adjacent ones of the plurality of solar battery modules 40 are connected with each other without any member therebetween, the connection part between the adjacent ones of the plurality of battery modules 40 has improved flexibility.

(Production Method for Solar Battery Module 40)

The following description discusses a production method for the solar battery module 40 with reference to FIGS. 4 through 8. FIGS. 4 through 7 are views with reference to which to explain steps included in the production method for the solar battery module 40.

First, five solar battery cells 20 are prepared. Then, inter connectors 31 are welded to the solar battery cells 20 by a spot welding method, via which inter connectors the solar battery cells 20 are electrically connected in series with one another (see FIG. 4). In this way, a solar battery string 30 is formed.

Next, other inter connectors 31 are welded to both ends of the solar battery string 30 also by the spot welding method. The both ends of the solar battery string 30 are connected with the bus sections 32 via such inter connectors 31. The bus sections 32 can be made from metal.

Then, as illustrated in FIG. 5, three solar battery strings 30 each having the bus sections 32 connected at its both ends are arranged in parallel with one another. According to FIG. 5, the rightmost one and the leftmost one of the solar battery strings 30 are arranged such that their n-type regions are on an upper side of FIG. 5 and their p-type regions are on a lower side of FIG. 5. The midmost one of the solar battery strings 30 is arranged such that its n-type region is on the lower side of FIG. 5 and its p-type region is on the upper side of FIG. 5. Note here that, the solar battery strings 30 can be arranged such that adjacent ones of the solar battery strings 30 have their n-type regions and p-type regions on opposite sides (e.g., FIG. 5), or can be arranged such that all the solar battery strings 30 have their n-type regions and p-type regions on the same sides.

Then, the flexible resin layer 33a is applied to the flexible resin film 34, which has openings formed in areas corresponding to positions of the bus sections 32. Thereafter, such a flexible resin film 34 is laminated to the solar battery strings 30 that are arranged in parallel with one another (see FIG. 6). Note here that the flexible resin film 34 is laminated such that its openings are on the non-light receiving surface side of the solar battery cells 20. In this way, a temporarily-jointed solar battery module 36 is obtained.

The flexible resin film 34 is preferably a polyimide film or a fluorine resin film. It is further preferable that front and back surfaces of the polyimide film or of the fluorine resin be subjected to a corona discharge treatment or be treated with a chemical agent etc. so that the front and back surfaces become easy to adhere. One specific example of such a film is KAPTON 100EN (manufactured by DU PONT-TORAY CO., LTD.) or the like, whose front and back surfaces have been subjected to the corona discharge treatment so that the surfaces become easy to adhere.

The flexible resin layers 33a, 33b, and 33c are preferably made from transparent flexible resin with high adhesiveness. Examples of such flexible resin encompass: epoxy resin, urethane resin, silicon resin, acrylic resin, and fluorine resin. Specific example of such flexible resin is DC93-500 (manufactured by Dow Corning Toray Co., Ltd).

Then, as illustrated in FIG. 7, the flexible resin layers 33b and 33c are applied to respective two exfoliate resin films 37. Such two exfoliate resin films 37 are laminated to the light receiving surface side and the non-light receiving surface side of the temporally-joined solar battery module 36, respectively.

The exfoliate films 37 serve as exfoliate paper. Each of the exfoliate films 37 is preferably a polyimide film or a fluorine resin film. A specific example of each of the exfoliate films 37 is KAPTON 200H (manufactured by DU PONT-TORAY CO., LTD.) or the like.

The laminating is carried out preferably with use of a generally-used lamination device under a condition where a heater temperature is a room temperature and a pressure is 0.02 MPa.

Then, as illustrated in FIG. 8, the two exfoliate films 37 are removed. Thereafter, parts of the flexible resin layers 33a and 33b, which parts correspond to positions of the openings in the flexible resin film 34, are removed. In this way, each of the bus sections 32 is partially exposed to outside.

The flexible solar battery module 40 is obtained through the above steps.

(Solar Battery Array 41)

Figure 1:
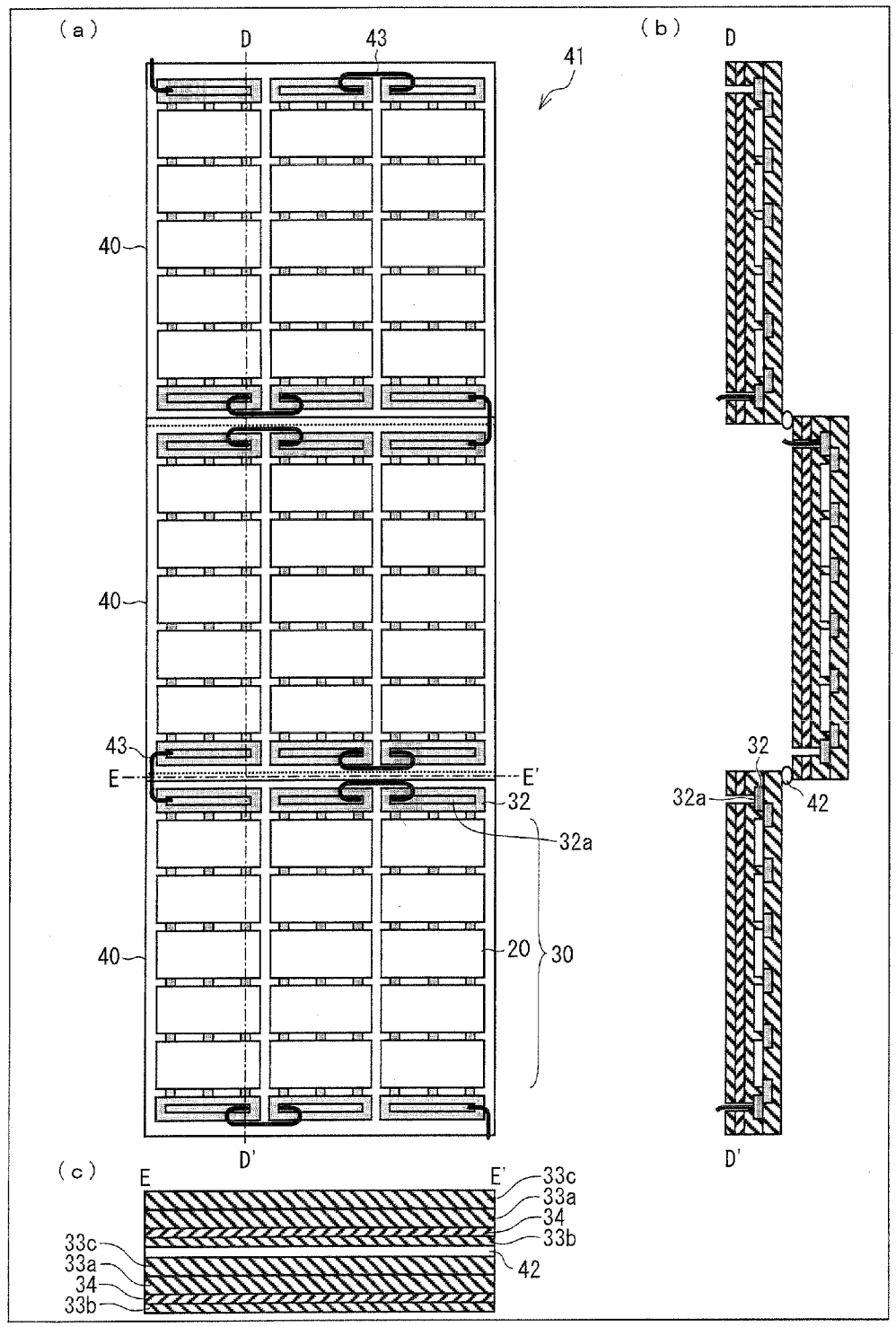
FIG. 1 illustrates a solar battery array of a first embodiment in accordance with the present invention. (a) of FIG. 1 is a plan view. (b) of FIG. 1 is a cross-sectional view taken along line D-D' of (a) of FIG. 1. (c) of FIG. 1 is a cross-sectional view taken along line E-E' of (a) of FIG. 1.

A solar battery array 41 can be constituted by a plurality of the foregoing flexible solar battery modules 40. The following description discusses the solar battery array 41 with reference to FIG. 1. FIG. 1 illustrates the solar battery array 41. (a) of FIG. 1 is a plan view. (b) of FIG. 1 is a cross-sectional view taken along line D-D' of (a) of FIG. 1. (c) of FIG. 1 is a cross-sectional view taken along line E-E' of (a) of FIG. 1.

The solar battery array 41 is constituted by three solar battery modules 40 connected with one another.

As illustrated in (a) of FIG. 1, the solar battery strings 30 in each of the solar battery modules 40 are connected in series with one another via corresponding ones of wires 43, which are connected with the bus sections 32. Similarly, the three solar battery modules 40 in the solar battery array 41 are connected in series with one another via corresponding ones of the wires 43. In this way, all the solar battery cells 20 included in the solar battery array 41 are electrically connected in series with one another. Note here that the wires 43 can be connected to the bus sections 32 by soldering.

According to this configuration, an electrical connection between adjacent ones of the solar battery modules 40 is made on the non-light receiving side of the solar battery array 41. Therefore, there are no metal components such as the bus sections 32 between adjacent ones of the solar battery modules 40 connected with each other. Accordingly, flexibility of the connection part between the adjacent ones of the solar battery modules 40 is improved.

Further, as illustrated in (b) of FIG. 1, the solar battery array 41 is configured such that adjacent ones of the solar battery modules 40 overlap each other at their neighboring ends, with their neighboring ends in contact with each other. The overlapped areas of the respective adjacent ones of the solar battery modules 40 are physically connected with each other with an adhesive agent 42. The adhesive agent is not limited to a particular kind. A specific example of the adhesive agent is RTV-S691 (manufactured by WACKER ASAHIKASEI SILICONE CO., LTD.) or the like.

According to this configuration, the solar battery array 41 is configured such that the connection part between adjacent ones of the solar battery modules 40 is uniform in its physical structure. Accordingly, mechanical strength of the connection part is improved.

Embodiment 2

A second embodiment in accordance with the present invention is described below with reference to FIGS. 9 through 11. Note here that constituents corresponding to the constituents of Embodiment 1 are assigned identical referential numerals.

(Solar Battery Module 50)

A solar battery module 50 of the present embodiment is described below with reference to FIG. 10. FIG. 10 illustrates a solar battery module of a second embodiment in accordance with the present invention. (a) of FIG. 10 is a plan view. (b) of FIG. 10 is a cross-sectional view taken along line F-F' of (a) of FIG. 10.

The solar battery module 50 is different from the foregoing solar battery module 40 of Embodiment 1 mainly in terms of (i) the number of solar battery cells 20 and the number of solar battery strings 30a, (ii) a laminated structure of flexible resin layers 45a and 45b and flexible resin films 46a and 46b, which are laminated to the solar battery strings 30a, and (iii) holes (second holes) 48 formed on the light receiving surface side. In view of this, the following description mainly discusses these differences.

Figure 10:
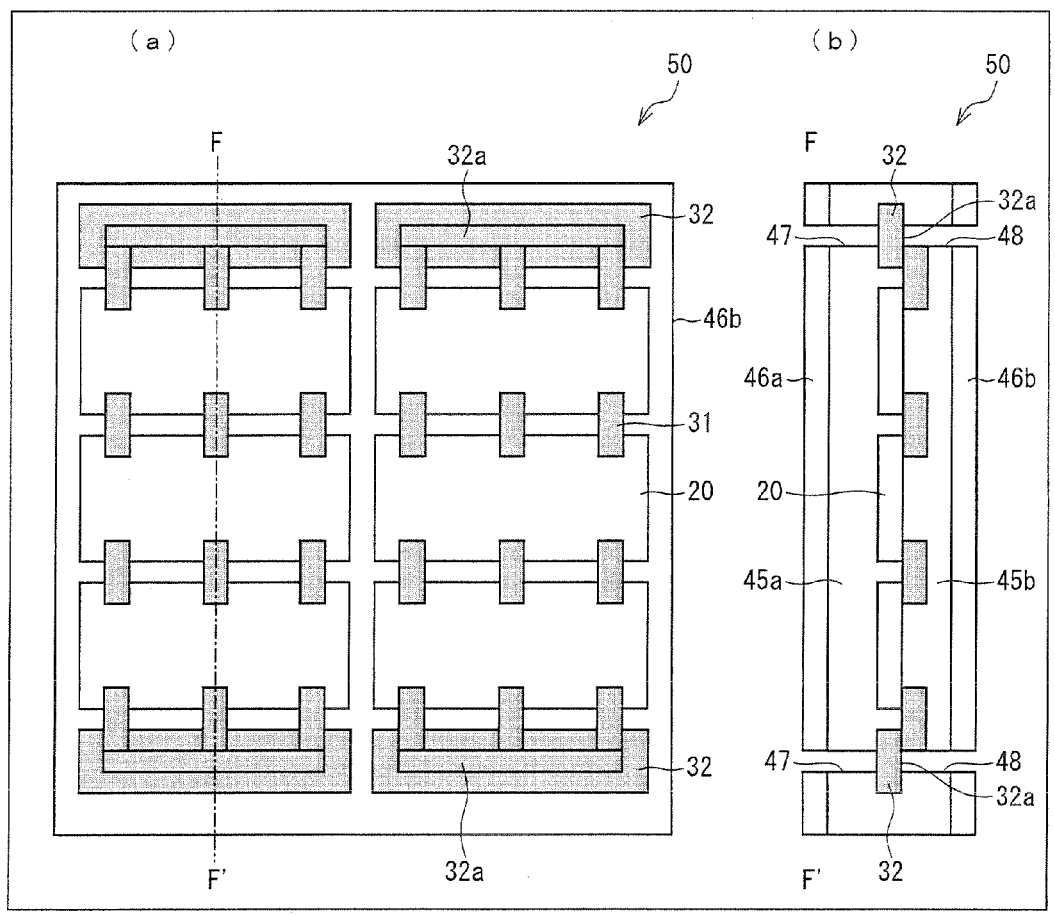
FIG. 10 illustrates a solar battery module of a second embodiment in accordance with the present invention. (a) of FIG. 10 is a plan view. (b) of FIG. 10 is a cross-sectional view taken along line F-F' of (a) of FIG. 10.
Figure 11:
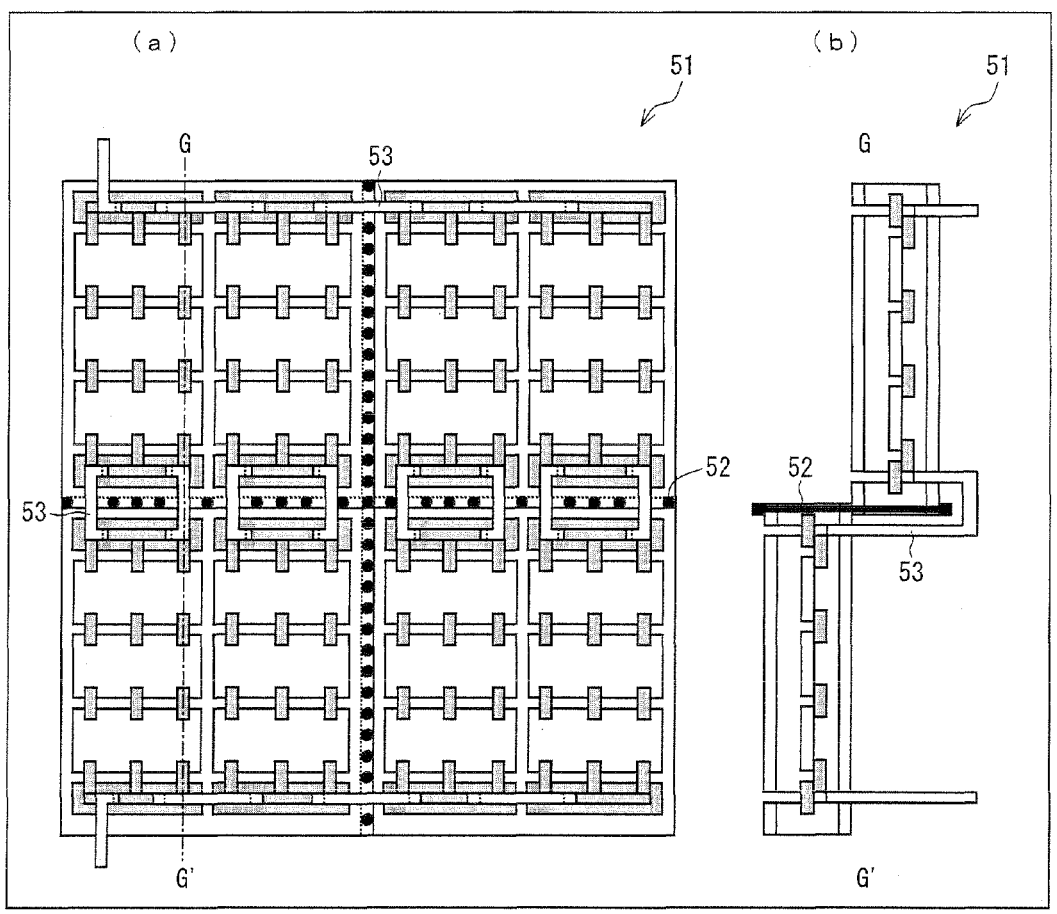
FIG. 11 illustrates a solar battery array of the second embodiment in accordance with the present invention. (a) of FIG. 11 is a plan view. (b) of FIG. 11 is a cross-sectional view taken along line G-G' of (a) of FIG. 11.
Figure 12:
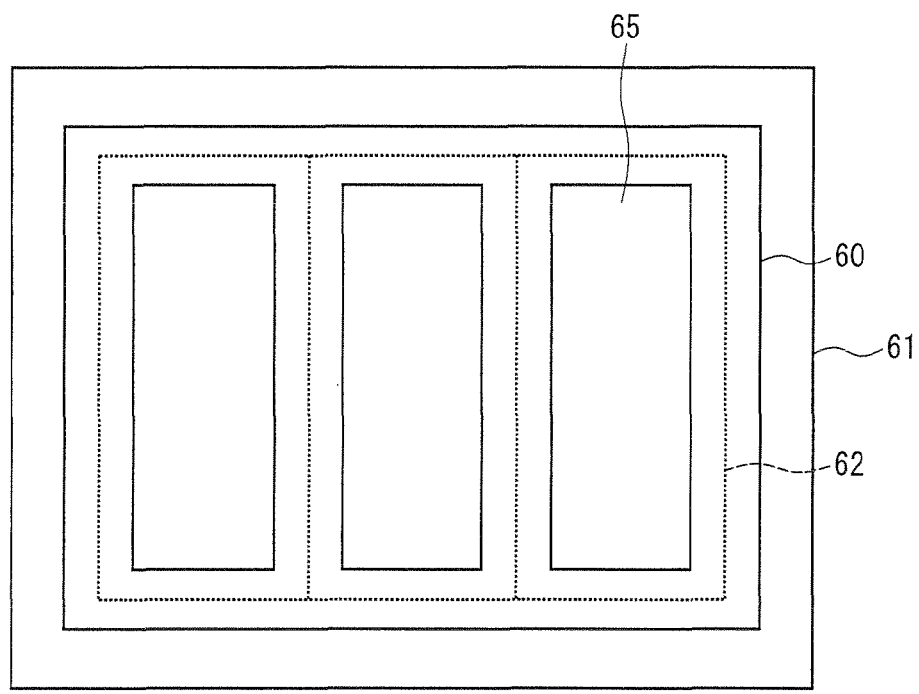
FIG. 12 is a plan view illustrating a conventional solar battery module.
Figure 13:
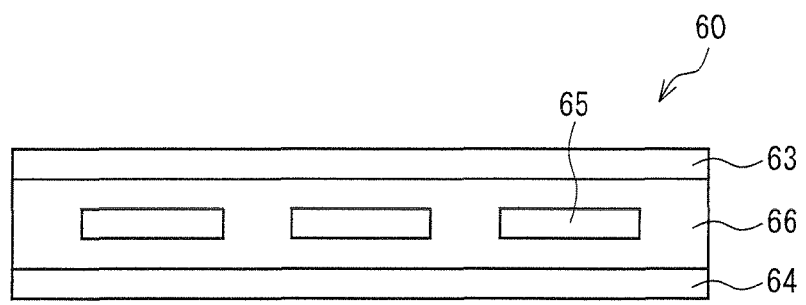
FIG. 13 is a cross-sectional view illustrating a conventional solar battery module.
Figure 14:
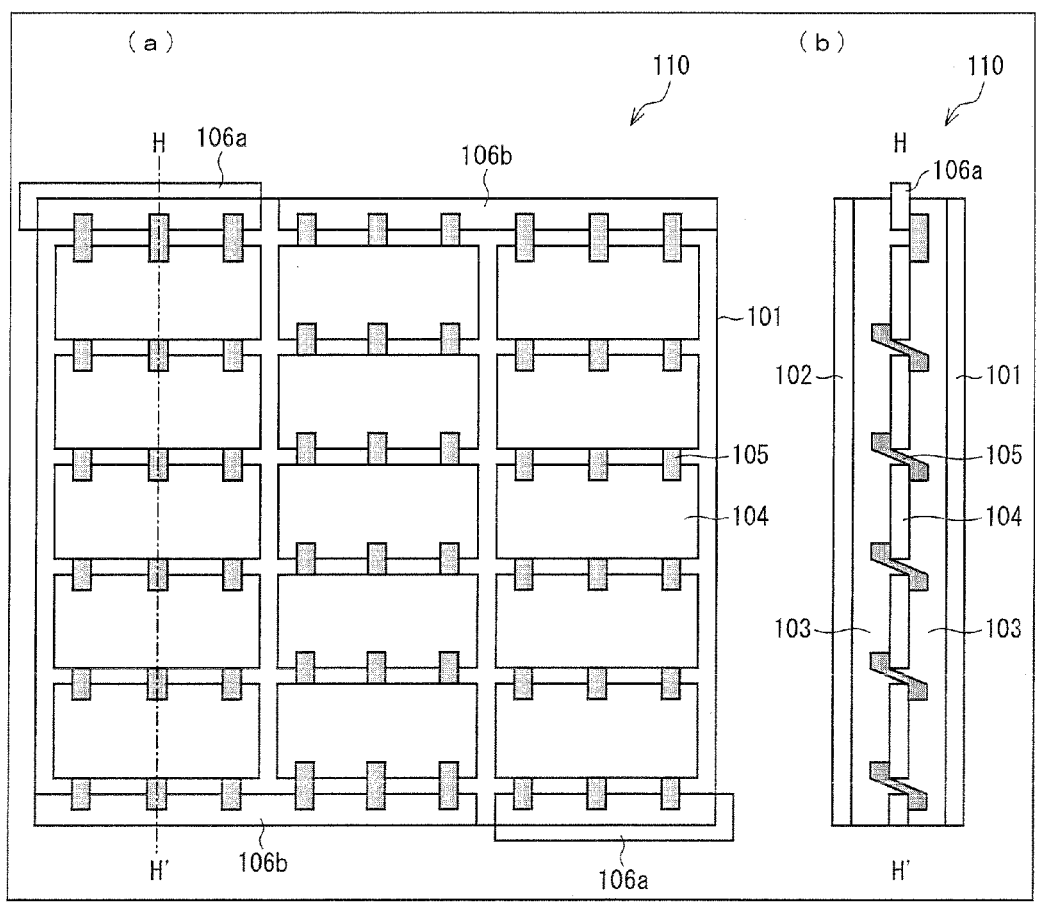
FIG. 14 illustrates a conventional solar battery module. (a) of FIG. 14 is a plan view. (b) of FIG. 14 is a cross-sectional view.
Figure 15:
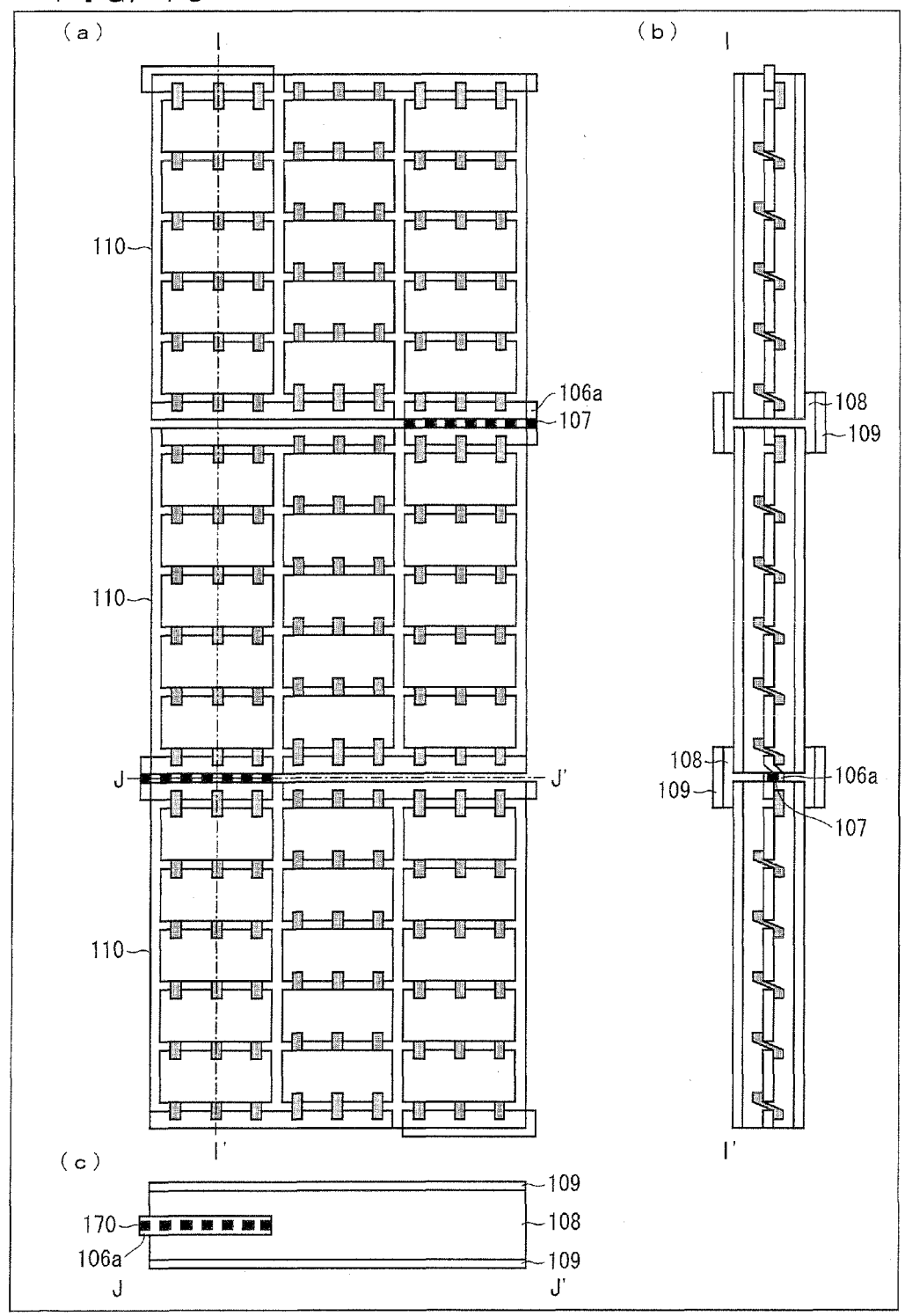
FIG. 15 illustrates a conventional solar battery array. (a) of FIG. 15 is a plan view. (b) of FIG. 15 is a cross-sectional view taken along line I-I' of (a) of FIG. 15. (c) of FIG. 15 is a cross-sectional view taken along line J-J' of (a) of FIG. 15.

As illustrated in (a) of FIG. 10, the solar battery module 50 includes two solar battery strings 30a. Each of the solar battery strings 30a includes three solar battery cells 20. Note however that, in the present invention, the number of the solar battery cells 20 and the number of the solar battery strings 30a are not limited to those described above, and can be any numbers depending on the situation.

As illustrated in (b) of FIG. 10, the solar battery module 50 is configured such that the flexible resin layers 45a and 45b and the flexible resin films 46a and 46b are laminated to the solar battery strings 30a, each of which has its ends connected with respective bus sections 32. The flexible resin layer 45b and the flexible resin film 46b are provided such that they are on top of each other in this order from the solar battery cells 20 toward the light receiving surface side. The flexible resin layer 45a and the flexible resin film 46a are provided such that they are on top of each other in this order from the solar battery cells 20 toward the non-light receiving side. That is, both sides of the solar battery module 50 are protected by the flexible resin films 46a and 46b, respectively.

The solar battery module 50 has, on its non-light receiving surface side, holes 47 penetrating the flexible resin layer 45a and the flexible resin film 46a. The holes 47 are formed in areas corresponding to positions of the bus sections 32. Further, the solar battery module 50 has, on its light receiving surface side, the holes 48 penetrating the flexible resin layer 45b and the flexible resin film 46b. The holes 48 are formed in areas corresponding to the positions of the bus sections 32. That is, part of each of the bus sections 32 is exposed through a corresponding one of the holes 47 and a corresponding one of the holes 48 on the non-light receiving surface side and on the light receiving side, respectively.

(Production Method for Solar Battery Module 50)

The following description discusses a production method for the solar battery module 50. The following description mainly discusses differences between the production method for the solar battery module 50 and that for the solar battery module 40 of Embodiment 1.

Figure 9:
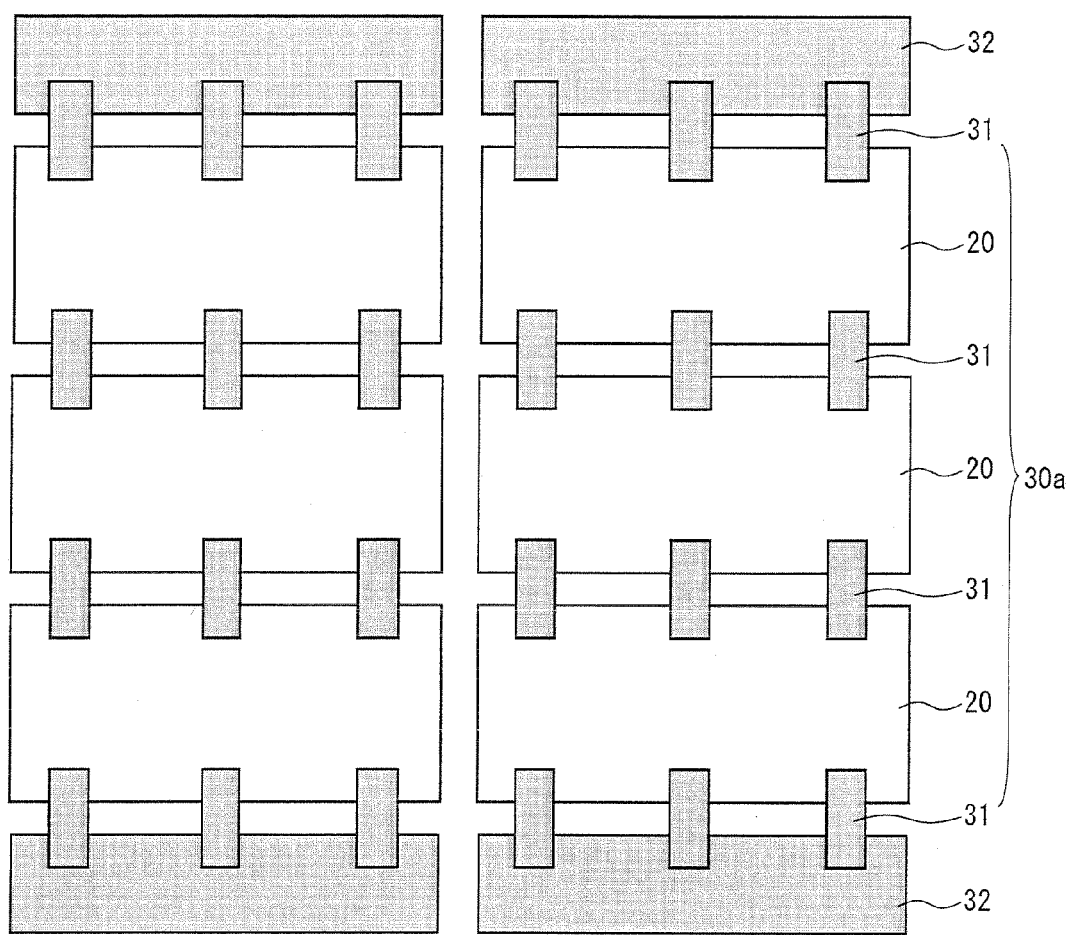
FIG. 9 illustrates how solar battery strings are arranged.

First, as illustrated in FIG. 9, two solar battery strings 30a are prepared. The solar battery strings 30a are arranged in the same way as in Embodiment 1. FIG. 9 illustrates how the solar battery strings 30a are arranged.

Next, the flexible resin layers 45a and 46b are applied to the flexible resin films 46a and 46b, respectively, by a roll coater method. Note here that the flexible resin films 46a and 46b have, in advance, openings formed in areas corresponding to positions of the bus sections 32.

Then, the flexible resin films 46a and 46b, to which the flexible resin layers 45a and 45b are applied, are laminated to the non-light receiving surface side and the light receiving surface side of the solar battery strings 30a having the bus sections 32 connected thereto, respectively. The laminating is carried out preferably by a generally-used lamination device for terrestrial application, under a condition where a heater temperature is a room temperature and a pressure is 0.01 MPa.

Each of the flexible resin films 46a and 46b is preferably a resin film with high transparency and high heat resistance, unlike the flexible resin film 34 of Embodiment 1. Examples of such a resin film encompass a resin film made from: an ethylene tetrafluoride-ethylene copolymer, vinylidene fluoride resin, polytrifluorochloroethylene resin, acrylic resin, polytrifluorochloroethylene resin-coated acrylic resin, or polyester resin. A specific example of such a resin film is AFLEX 50NS (manufactured by ASAHI GLASS CO., LTD.) or the like.

Thereafter, parts of the flexible resin layer 45a, which parts correspond to positions of the openings in the flexible resin film 46a, are removed so that each of the bus sections 32 is partially exposed. Similarly, parts of the flexible resin layer 45b, which parts correspond to positions of the openings in the flexible resin film 46b, are removed so that each of the bus sections 32 is partially exposed.

The solar battery module 50 is obtained through the above steps.

(Solar Battery Array 51)

A solar battery array 51 is constituted by a plurality of the foregoing solar battery modules 40, and includes solar battery cells 20 which are electrically connected in series with one another. The following description discusses the solar battery array 51 with reference to FIG. 11. FIG. 11 illustrates the solar battery array 51. (a) of FIG. 11 is a plan view. (b) of FIG. 11 is a cross-sectional view taken along line G-G' of (a) of FIG. 11.

The solar battery array 51 of the present embodiment is different from the foregoing solar battery array 41 of Embodiment 1 mainly in that solar battery modules 50 are physically connected with one another with use of rivets.

Since flexible resin films 46a and 46b each having high strength are provided as outermost layers of each of the solar battery modules 50, the rivets are suitable for physical connection between adjacent ones of the solar battery modules 50 that constitute the solar battery array 51. Note, however, that the adjacent ones of the solar battery modules 50 are physically connected with each other not necessarily with use of the rivets, and therefore can be physically connected with each other by sewing.

Further, since the solar battery array 51 has holes 47 and holes 48 on its non-light receiving surface side and light receiving surface side, respectively, wires 53 can be welded to bus sections 32 by a spot welding method. The spot welding method is such that (i) electrodes are pressed to a surface of each of the bus sections 32 through a corresponding one of the holes 47, which surface is right opposite to a corresponding one of a plurality of electrically-connecting means 32a, and then (ii) an electrical current is applied between the electrodes. In this way, the wires 53 are welded to the plurality of electrically-connecting means 32a.

It should be noted that the number of solar battery cells in each of the solar battery strings, the number of the solar battery strings in each of solar battery modules, and the number of the solar battery modules in the solar battery array are not limited to those described above, and can be any numbers depending on the situation. Further, positions of the solar battery modules constituting the solar battery array are not limited to those described above, and can be any positions depending on the situation.

As described so far, in order to attain the above object, a solar battery module in accordance with the present invention is a solar battery module for constituting a solar battery array, including: at least one solar battery string that is constituted by a plurality of solar battery cells electrically connected in series with each other; bus sections electrically connected with respective endmost ones of the plurality of solar battery cells that constitute said at least one solar battery string; and at least one flexible resin layer provided on each of both sides, which are a first side and a second side, of the solar battery module so as to sandwich said at least one solar battery string and the bus sections, the first side of the both sides of the solar battery module having first holes, through which the bus sections are each partially exposed, and the bus sections having areas which are exposed through the respective first holes, the areas serving as a respective plurality of electrically-connecting means.

A plurality of solar battery modules in accordance with the present invention are to constitute a solar battery array by being electrically connected with each other. In a case where each of the plurality of the solar battery modules is constituted by a flexible material, the each of the plurality of the solar battery modules is used as a flexible solar battery sheet. Accordingly, the solar battery array constituted by the plurality of solar battery modules is used as a flexible solar battery sheet array.

The plurality of solar battery modules in accordance with the present invention are electrically connected with each other via the plurality of electrically-connecting means of the bus sections. Note here that the plurality of electrically-connecting means of the bus sections can be connected with a wire by soldering etc. According to this configuration, the plurality of solar battery modules can be connected with each other via the wire. The bus sections are connected with respective endmost ones of the plurality of solar battery cells connected with each other, and collect electric power. Generally, the bus sections are made from metal.

According to this configuration, the plurality of electrically-connecting means of the bus sections are exposed through the respective first holes. Therefore, each of the bus sections is configured such that it does not protrude from the at least one flexible resin layer. Accordingly, there are no other members (e.g., the bus sections) between adjacent ones of the plurality of solar battery modules when the plurality of solar battery modules are electrically connected with each other. This makes it possible to achieve an advantage that the connected plurality of solar battery modules as a whole maintains its flexibility and keeps its mechanical strength uniform.

The solar battery module in accordance with the present invention is preferably configured such that: a number of said at least one solar battery string is two or more; and the two or more solar battery strings are electrically connected in series with each other via corresponding ones of the plurality of electrically-connecting means.

According to this configuration, the two or more solar battery strings in the solar battery module are connected with each other via the plurality of electrically-connecting means of the respective bus sections, which are at both ends of the two or more solar battery strings. Accordingly, it is possible to downsize each of the bus sections of the solar battery module in accordance with the present invention, as compared with a conventional configuration in which each of some of the bus sections belongs to two or more solar battery strings. This makes it possible to improve flexibility of the solar battery module.

Further, the two or more solar battery strings in the solar battery module can be connected with each other via the wire, which is connected with corresponding ones of the plurality of electrically-connecting means of the bus sections. In this way, the two or more battery strings are electrically connected in series with each other easily.

The solar battery module in accordance with the present invention is preferably configured such that: light receiving surfaces of the respective plurality of solar battery cells are situated on the second side; and the plurality of electrically-connecting means are on the first side.

Generally, the light receiving surfaces of the plurality of solar battery cells, which surfaces receive sunlight, are on one of both sides of the solar battery module. In this regard, according to the above configuration, an electrical connection between a plurality of solar battery modules is made on the other one of the both sides of each of the plurality of solar battery modules, i.e., on a side on which surfaces opposite to the light receiving surfaces of the plurality of solar battery cells are situated. This makes it possible to connect the plurality of solar battery modules in accordance with the present invention without affecting electric power generation by the plurality of solar battery cells. Particularly, in a case where the plurality of electrically-connecting means of the bus sections are connected with each other via the wire, the wire does not shield the light receiving surfaces of the plurality of solar battery cells against sunlight. Accordingly, the wire can be freely drawn.

It is preferable that the solar battery module in accordance with the present invention be configured such that: the second side having second holes so as to correspond to positions of the respective first holes, through which second holes the bus sections are each partially exposed.

According to this configuration, part, of each of the bus sections, which is right opposite to a corresponding one of the plurality of electrically-connecting means, is exposed. That is, the part of each of the bus sections is exposed on both sides of the solar battery module. Accordingly, the wire can be welded to corresponding ones of the plurality of electrically-connecting means of the bus sections by parallel gap welding, which is more definite method than soldering.

Specifically, first, the wire is placed on a corresponding one of the plurality of electrically-connecting means through a corresponding one of the first holes. Next, parallel gap electrodes are pressed to the corresponding one of the plurality of electrically-connecting means through a corresponding one of the second holes. Then, an electrical current is applied between the parallel gap electrodes. In this way, it is possible to weld the wire to corresponding ones of the plurality of electrically-connecting means.

The solar battery module in accordance with the present invention can further include: a flexible resin film provided on the first side which is the opposite side of the second side on which light receiving surfaces of the respective plurality of solar battery cells are situated, the flexible resin film being provided between said at least one solar battery string and said at least one flexible resin layer. Alternatively, the solar battery module in accordance with the present invention can further include: a flexible resin film provided on both of the first side and the second side of the solar battery module so as to cover said at least one flexible resin layer.

Generally, a flexible resin film is greater in strength than a flexible resin layer. According to the above configuration, since the flexible resin film is included in the solar battery module, the solar battery module has high strength. Accordingly, the solar battery module keeps its strength even if a thickness of the entire solar battery module is reduced.

Further, according to the configuration in which the flexible resin films are provided on both sides of the solar battery module, outer surfaces of the solar battery module are increased in their strength. Accordingly, a rivet etc. can be easily used for physically connecting a plurality of solar battery modules so as to form a solar battery array.

A solar battery array in accordance with the present invention includes: a plurality of the foregoing solar battery modules, the plurality of solar battery modules being electrically connected in series with each other via corresponding ones of the plurality of electrically-connecting means, each of which serves as an end of an electrical connection in a corresponding one of the plurality of solar battery modules.

According to this configuration, it is possible to easily produce a large-scale solar battery array in accordance with the present invention by connecting the plurality of solar battery modules. In addition, according to the solar battery array in accordance with the present invention, it is possible to improve flexibility of the entire solar battery array because there are no members such as the bus sections between adjacent ones of the plurality of solar battery modules.

The solar battery array in accordance with the present invention can be configured such that: the plurality of solar battery modules are arranged such that adjacent ones of the plurality of solar battery modules overlap each other at their neighboring ends; and said neighboring ends are physically connected with each other by bonding, sewing, or a rivet.

According to this configuration, easy methods such as bonding, sewing, or the rivet can be used for physically connecting the plurality of solar battery modules. Therefore, it is possible to produce a large-scale solar battery array at low cost. Further, since the connection part between adjacent ones of the plurality of solar battery modules is uniform in its physical structure, mechanical strength of the solar battery array as a whole is improved.

The solar battery array in accordance with the present invention can further include: a wire connected with corresponding ones of the plurality of electrically-connecting means, the two or more of solar battery strings being electrically connected in series with each other via the corresponding ones of the plurality of electrically-connecting means and the wire.

The invention is not limited to the description of the embodiments above, but may be altered within the scope of the claims. An embodiment based on a proper combination of technical means disclosed in different embodiments is encompassed in the technical scope of the invention.

INDUSTRIAL APPLICABILITY

The present invention is suitably applicable to a constituent unit of a large-scale solar battery sheet. The present invention can be employed in for example a solar battery for space application (i.e., a solar battery for an artificial satellite) or the like.

REFERENCE SIGNS LIST

20 Solar battery cell
30 Solar battery string
31 Inter connector
32 Bus section
32a Electrically-connecting means
33a, 33b, 33c, 45a, 45b Flexible resin layers
34, 46a, 46b Flexible resin films
38, 47, 48 Holes
40 50 Solar battery module
41, 51 Solar battery array
42 Adhesive agent
43, 53 Wires
52 Rivet

The invention claimed is:

1. A method for producing a solar battery array that is constituted by a plurality of solar battery modules,
   each of the plurality of solar battery modules including:
      at least one solar battery string that is constituted by a plurality of solar battery cells electrically connected in series with each other,
      bus sections electrically connected with respective endmost ones of the plurality of solar battery cells that constitute said at least one solar battery string, and
      at least one flexible resin layer provided on each of both sides, which are a first side and a second side, of said each of the plurality of solar battery modules so as to sandwich said at least one solar battery string and the bus sections,
   the method, comprising the steps of:
   (a) forming first holes, through which the bus sections are each partially exposed, on the first side of the both sides of said each of the plurality of solar battery modules; and
   (b) electrically connecting said each of the plurality of solar battery modules and another one of the plurality of solar battery modules via areas of the bus sections which areas are exposed through the respective first holes, the areas serving as a respective plurality of electrically-connecting means.

2. The method according to claim 1, wherein:
   the step (b) includes the step (c) of forming a wire connected with corresponding ones of the plurality of electrically-connecting means,
   said each of the plurality of solar battery modules and said another one of the plurality of solar battery modules are electrically connected with each other via the corresponding ones of the plurality of electrically-connecting means and the wire.

3. The method according to claim 2, wherein:
   the method further comprising the steps of (d) forming second holes, through which the bus sections are each partially exposed, on the second side of said each of the plurality of solar battery modules so that the second holes correspond to positions of the respective first holes; and
   (e) welding the wire to the corresponding ones of the plurality of electrically-connecting means through a corresponding one of the second holes.

4. The method according to claim 3, wherein:
   the step (c) includes the steps of (f) welding the wire to the corresponding ones of the plurality of electrically-connecting means by (i) pressing parallel gap electrodes to the corresponding ones of the plurality of electrically-connecting means through a corresponding one of the second holes and (ii) applying an electrical current between the parallel gap electrodes.

5. The method according to claim 1, wherein:
   light receiving surfaces of the respective plurality of solar battery cells are situated on the second side, and the plurality of electrically-connecting means are on the first side.

6. The method according to claim 1, wherein:
   said at least one flexible resin layer on the first side comprises a plurality of flexible resin layers; and
   said each of the plurality of solar battery modules further includes a flexible resin film provided on the first side which is the opposite side of the second side on which light receiving surfaces of the respective plurality of solar battery cells are situated, the flexible resin film being provided between one of the plurality of flexible resin layers and another one of the plurality of flexible resin layers.

7. The method according to claim 1, wherein:
   said each of the plurality of solar battery modules further includes a flexible resin film provided on both of the first side and the second side of said each of the plurality of solar battery modules so as to cover said at least one flexible resin layer.

8. The method according to claim 1, wherein:
   said at least one solar battery string comprises a plurality of solar battery strings,
   the method further comprising the step of (g) electrically connecting the plurality of solar battery strings with each other via corresponding ones of the plurality of electrically-connecting means.

9. The method according to claim 8, wherein:
   the step (g) includes the step of (h) forming a wire connected with corresponding ones of the plurality of electrically-connecting means, and
   the plurality of solar battery strings are electrically connected with each other via the corresponding ones of the plurality of electrically-connecting means and the wire.

10. A method for producing a flexible solar battery array that is constituted by a plurality of solar battery modules,
    each of the plurality of solar battery modules including
       at least one solar battery string that is constituted by a plurality of solar battery cells electrically connected in series with each other,
       bus sections electrically connected with respective endmost ones of the plurality of solar battery cells that constitute said at least one solar battery string, and
       at least one flexible resin layer provided on each of both sides, which are a first side and a second side, of said each of the plurality of solar battery modules so as to sandwich said at least one solar battery string and the bus sections,
    the method comprising the steps of:
    forming first holes, through which the bus sections are each partially exposed, on the first side of the both sides of said each of the plurality of solar battery modules;
    electrically connecting each of the plurality of solar battery modules and another one of the plurality of solar battery modules via (i) a wire and (ii) areas of the bus sections which areas are exposed through the respective first holes, the areas serving as a respective plurality of electrically-connecting means, and
    physically connecting the plurality of solar battery modules so that adjacent ones of the plurality of solar battery modules overlap each other at their neighboring ends.

11. A method for producing a flexible solar battery module, the flexible solar battery module including
  a plurality of solar battery strings each of which is constituted by a plurality of solar battery cells electrically connected in series with each other,
  bus sections electrically connected with respective endmost ones of the plurality of solar battery cells that constitute said each of the plurality of solar battery strings, and
  at least one flexible resin layer provided on each of both sides, which are a first side and a second side, of the flexible solar battery module so as to sandwich said each of the plurality of solar battery strings and the bus sections,
the method comprising the steps of:
forming first holes, through which the bus sections are each partially exposed, on the first side of the both sides of the flexible solar battery module;
electrically connecting the plurality of solar battery strings via (i) a wire and (ii) areas of the bus sections which areas are exposed through the respective first holes, the areas serving as a respective plurality of electrically-connecting means.

* * * * *